US009336996B2

(12) United States Patent
Long et al.

(10) Patent No.: US 9,336,996 B2
(45) Date of Patent: May 10, 2016

(54) PLASMA PROCESSING SYSTEMS INCLUDING SIDE COILS AND METHODS RELATED TO THE PLASMA PROCESSING SYSTEMS

(75) Inventors: Maolin Long, Cupertino, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 547 days.

(21) Appl. No.: 13/034,332

(22) Filed: Feb. 24, 2011

(65) Prior Publication Data

US 2012/0217222 A1    Aug. 30, 2012

(51) Int. Cl.
| H01L 21/306 | (2006.01) |
| C23C 16/00 | (2006.01) |
| H01J 37/32 | (2006.01) |
| H05H 1/46 | (2006.01) |

(52) U.S. Cl.
CPC ........... *H01J 37/321* (2013.01); *H01J 37/3211* (2013.01); *H01J 37/3244* (2013.01); *H01J 37/32119* (2013.01); *H01J 37/32431* (2013.01); *H01J 37/32458* (2013.01); *H01J 37/32513* (2013.01); *H05H 1/46* (2013.01); *H05H 2001/4652* (2013.01); *H05H 2001/4667* (2013.01)

(58) Field of Classification Search
CPC .............. H01J 37/321; H01J 37/3211; H01J 37/32119; H01J 37/32431; H01J 37/32458; H01J 37/32513
USPC .................. 118/715, 723 I, 723 IR, 723 AN; 156/345.33, 345.34, 345.48, 345.49; 315/111.51
See application file for complete search history.

(56) References Cited

U.S. PATENT DOCUMENTS

| 5,571,366 | A | * | 11/1996 | Ishii et al. ................. 156/345.26 |
| 5,753,044 | A | | 5/1998 | Hanawa et al. |
| 6,009,830 | A | | 1/2000 | Li et al. |
| 6,071,372 | A | | 6/2000 | Ye et al. |
| 6,286,451 | B1 | | 9/2001 | Ishikawa et al. |
| 6,833,051 | B2 | * | 12/2004 | Kazumi et al. ........... 156/345.48 |
| 2001/0003271 | A1 | * | 6/2001 | Otsuki ..................... 118/723 I |
| 2006/0060141 | A1 | * | 3/2006 | Kamaishi et al. ............. 118/715 |
| 2006/0174834 | A1 | * | 8/2006 | Long et al. .................. 118/723 I |
| 2007/0037397 | A1 | | 2/2007 | Lu et al. |
| 2007/0221622 | A1 | | 9/2007 | Kim |
| 2010/0243164 | A1 | * | 9/2010 | Sharpless et al. ......... 156/345.33 |

OTHER PUBLICATIONS

"International Search Report", PCT Application No. PCT/US2012/25219, Mailing Date: May 25, 2012.
"Written Opinion", PCT Application No. PCT/US2012/25219, Mailing Date: May 25, 2012.

* cited by examiner

*Primary Examiner* — Luz Alejandro Mulero
(74) *Attorney, Agent, or Firm* — Beyer Law Group LLP

(57) ABSTRACT

A plasma processing system for generating plasma to process a wafer. The plasma processing system includes a set of top coils for initiating the plasma, a set of side coils for affecting distribution of the plasma, and a chamber structure for containing the plasma. The chamber structure includes a chamber wall and a dielectric member. The dielectric member includes a top, a vertical wall, and a flange. The top is connected through the vertical wall to the flange, and is connected through the vertical wall and the flange to the chamber wall. The set of top coils is disposed above the top. The set of side coils surrounds the vertical wall. A vertical inner surface of the vertical wall is configured to be exposed to the plasma. The inner diameter of the vertical wall is smaller than the inner diameter of the chamber wall.

15 Claims, 5 Drawing Sheets

PLASMA PROCESSING SYSTEMS INCLUDING SIDE COILS AND METHODS RELATED TO THE PLASMA PROCESSING SYSTEMS

BACKGROUND OF THE INVENTION

The present invention is related to plasma processing systems. In particular, the present invention is related to plasma processing systems including coils for tuning plasma distribution.

Plasma processing systems, such as capacitively coupled plasma (CCP) systems and inductively coupled plasma (ICP) systems, are employed in various industries for fabricating devices on wafers. For example, the industries may include semiconductor, magnetic read/write and storage, optical system, and micro-electromechanical system (MEMS) industries.

A plasma processing system may generate and sustain plasma in a plasma processing chamber to perform etching and/or deposition on a wafer such that device features may be formed on the wafer. When a wafer is processed in an existing plasma processing system, the plasma density at the center portion of the wafer or near the center portion of the wafer may be substantially higher than the plasma density at the edge portion of the wafer or near the edge portion of the wafer. As a result, plasma processing rates (e.g., etch rates) may be substantially non-uniform or substantially inconsistent across the surface of the wafer, and the manufacturing yield may be undesirable.

SUMMARY OF INVENTION

An embodiment of the invention is related to a plasma processing system for generating plasma to process at least a wafer. The plasma processing system may include a chuck for supporting the wafer. The plasma processing system may also include a chamber structure for containing the plasma. The chamber structure may include a cylindrical chamber wall. The chamber structure may further include a dielectric member disposed above the cylindrical chamber wall and coupled with the cylindrical chamber wall. The dielectric member may include a top disposed over the chuck, a vertical wall connected to the top, and a flange connected to the vertical wall. The top may be connected through the vertical wall to the flange. The top may be connected through the vertical wall and the flange to the cylindrical chamber wall. The plasma processing system may also include a set of top coils disposed above the top for initiating the generation of the plasma. A horizontal bottom surface of the top may be configured to be exposed to the plasma when the wafer is processed with the plasma. The plasma processing system may also include a set of side coils surrounding the vertical wall and disposed over at least a portion of the flange for affecting the distribution of the plasma. A vertical inner surface of the vertical wall may be configured to be exposed to the plasma and configured to confine at least a portion of the plasma when the wafer is processed with the plasma. The inner diameter of the vertical wall may be smaller than the inner diameter of the cylindrical chamber wall.

The above summary relates to only one of the many embodiments of the invention disclosed herein and is not intended to limit the scope of the invention, which is set forth is the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1A:
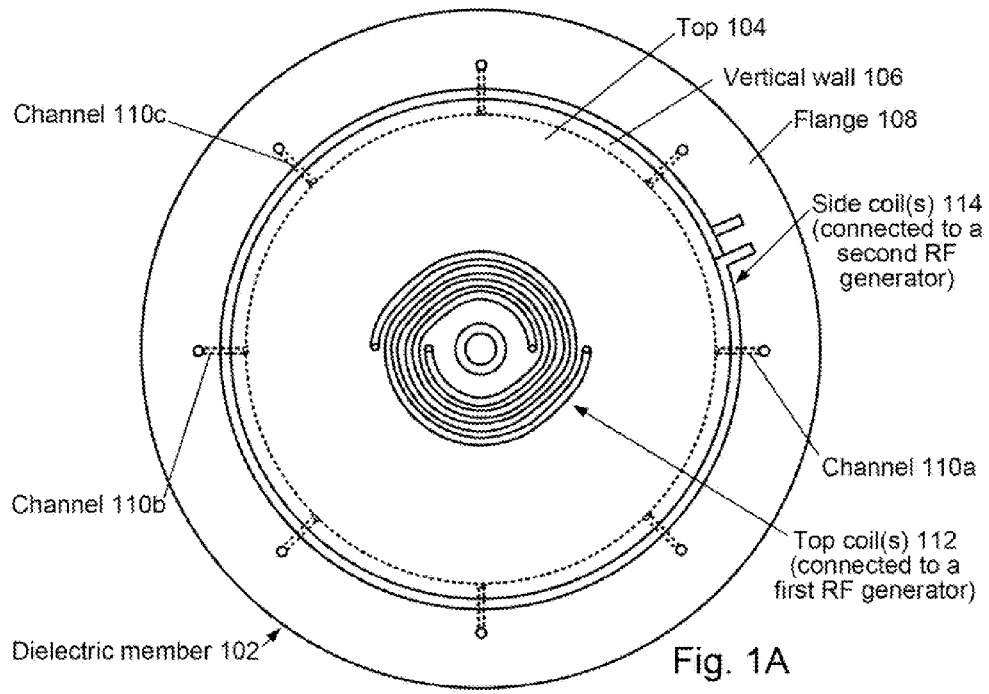
FIG. 1A shows a schematic representation illustrating a top view of a dielectric member and two sets of coils for use in a plasma processing system in accordance with one or more embodiments of the present invention.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer-readable medium on which computer-readable instructions for carrying out embodiments of the inventive technique are stored. The computer-readable medium may include, for example, semiconductor, magnetic, opto-magnetic, optical, or other forms of computer-readable medium for storing computer-readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

One or more embodiments of the invention are related to a plasma processing system for generating plasma to process at least a wafer. The plasma processing system may include a chuck for supporting the wafer. The plasma processing system may also include a chamber structure for containing the plasma. The chuck and the wafer may be disposed inside the chamber structure.

The chamber structure may include a cylindrical chamber wall. The chamber structure may further include a dielectric member disposed above the cylindrical chamber wall and coupled with the cylindrical chamber wall.

The dielectric member may include a top disposed over the chuck, a vertical wall connected to the top, and a flange connected to the vertical wall. The dielectric member may have a shape of a top hat: the top may be circular-shaped; the vertical wall may be cylinder-shaped or tube-shaped; the flange may be ring-shaped. The top may be connected through the vertical wall to the flange. In addition, the top may be connected through the vertical wall and the flange to the cylindrical chamber wall. The dielectric member may be a one-piece structure, wherein the top, the vertical wall, and the flange may be integral parts of the dielectric member. Alternatively or additionally, one or more of the top, the vertical wall, and the flange may be one or more detachable parts of the dielectric member.

The plasma processing system may also include a set of top coils disposed above the top for initiating the generation of the plasma. A horizontal bottom surface of the top may be configured to be exposed to the plasma for confining the plasma under the top to process the wafer.

The plasma processing system may also include a set of side coils surrounding the vertical wall and disposed over at least a portion (e.g., an inner portion) of the flange for generating additional ions to supplement (and/or to maintain) the plasma, especially near the edge of the wafer and/or at the edge of the wafer. The set of side coils may be powered separately from the set of top coils. Advantageously, the set of side coils may be employed to affect the distribution of the plasma (especially at the edge of the wafer and/or near the edge of the wafer), thereby tuning and optimizing the plasma processing rates across the wafer.

The outer diameter of the vertical wall (which may be related to the position of the set of side coils) may be substantially smaller than the inner diameter of the cylindrical chamber wall. Additionally or alternatively, the inner diameter of the flange may be substantially smaller than the inner diameter of the cylindrical chamber wall. Accordingly, the set of side coils may be disposed substantially close to the edge of the wafer; therefore, the set of side coils may have a sufficiently strong effect on tuning the plasma density at the edge of the wafer and/or near the edge of the wafer.

In addition, the inner diameter of the vertical wall may be substantially smaller than the inner diameter of the cylindrical chamber wall. Accordingly, a vertical inner surface of the vertical wall (configured to be exposed to the plasma) may confine at least a portion of the plasma in a space adjacent to the edge of the wafer when the wafer is processed with the plasma, for maintaining a desirable plasma density at the edge of the wafer and/or near the edge of the wafer.

With the abovementioned configuration of the plasma processing system, the plasma density (or ion density) at the edge of the wafer and/or near the edge of the wafer may be maintained at a desirable level that is comparable to the plasma density at the center of the wafer and/or near the center of the wafer. Advantageously, substantially uniform plasma processing rates (e.g., deposition and/or etch rates) may be provided across the wafer, and a desirable manufacturing yield may be achieved.

One or more embodiments of the invention are related to a method for processing a wafer with plasma in a plasma processing system. The plasma processing system may include a chamber structure for containing the plasma. The chamber structure may include a cylindrical chamber wall. The chamber structure may further include a dielectric member disposed above the cylindrical chamber wall and coupled with the cylindrical chamber wall. The dielectric member may include a first element and a second element. The second element may be connected to the first element and may be substantially perpendicular to the first element.

The method may include initiating, using a set of top coils disposed above the first element of the dielectric member, the plasma inside the chamber structure. The step of initiating may include providing a first signal (e.g., a first power) of a first frequency to the set of top coils. The first frequency may be high enough to initiate the generation of the plasma. For example, the first frequency may be a radio frequency of 13.56 MHz.

The method may also include, after initiating the plasma, using a set of side coils surrounding the second element to generate additional ions to supplement the plasma (especially at the edge of the wafer and/or near the edge of the wafer), thereby affecting the distribution of the plasma, for improving the uniformity of the plasma processing. A second signal (e.g., a second power) of a second frequency may be supplied to the set of side coils for generating the addition ions. The second frequency may be substantially different from the first frequency, such that potential interference between the first signal (e.g., the second power) and the second signal (e.g., the second power) may be prevented without requiring additional shielding arrangements. In one or more embodiments, the second frequency may be substantially lower than the first frequency. As an example, the second frequency may be a radio frequency in the range from 500 KHz to 4 MHz, such as 2 MHz.

The method may also include moving the set of side coils along an outer surface of the second element in a direction perpendicular to the top surface of the wafer when the wafer is processed in the plasma processing system, for tuning and optimizing the distribution of the plasma. Accordingly, the uniformity of plasma distribution on the wafer may be optimized. Advantageously, substantially uniform plasma processing rates may be provided across the wafer, and a desirable manufacturing yield may be achieved.

The features and advantages of the present invention may be better understood with reference to the figures and discussions that follow.

Figure 1B:
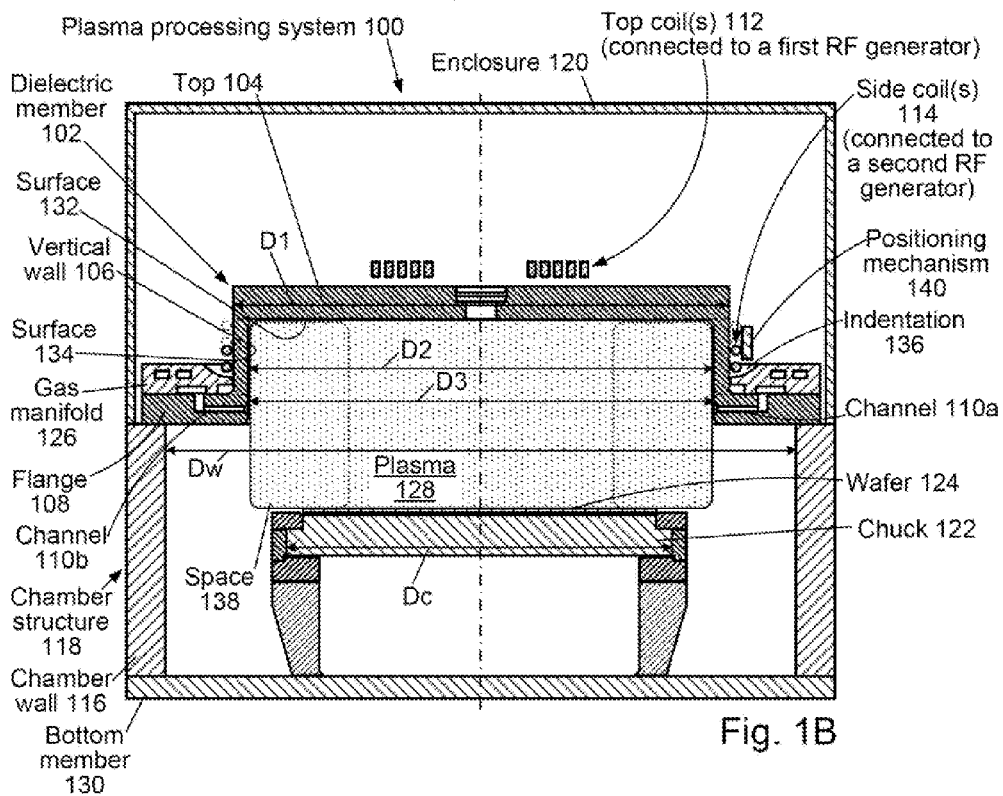
FIG. 1B shows a schematic representation illustrating a partial cross-sectional view of a plasma processing system in accordance with one or more embodiments of the present invention.

FIG. 1A shows a schematic representation illustrating a top view of a dielectric member 102 and two sets of coils for use in a plasma processing system in accordance with one or more embodiments of the present invention. FIG. 1B shows a schematic representation illustrating a partial cross-sectional view of a plasma processing system 100 (which may include dielectric member 102) in accordance with one or more embodiments of the present invention.

Plasma processing system 100 may include a chuck 122 for supporting a wafer 124. Plasma processing system 100 may also include a chamber structure 118 for containing plasma 128 utilized in processing wafer 124. Chuck 122 and wafer 124 may be disposed inside chamber structure 118. Plasma processing system 120 may also include an enclosure 120 coupled with chamber structure 118 for enclosing an protecting one or more components of plasma processing system 120 discussed below.

Chamber structure 118 may include a bottom member 130, which may be made of anodized aluminum. Chamber structure 118 may also include a cylindrical chamber wall 116 (which also may be made of anodized aluminum) disposed above bottom member 130 and coupled with bottom member 130. Chamber structure 118 may further include dielectric member 102 disposed above chamber wall 116 and coupled with chamber wall 116. Dielectric member 102 may be made of a ceramic material, such as such as aluminum oxide ($Al_2O_3$) or aluminum nitride (AlN), or may include one or more components made of one or more ceramic materials.

Dielectric member 102 may include a horizontal top 104 disposed over chuck 122, a vertical wall 106 connected to top 104, and a horizontal flange 108 connected to vertical wall 106. Dielectric member 102 may have a shape similar to a top hat: top 104 may be circular-shaped; vertical wall 106 may be cylinder-shaped or tube-shaped; flange 108 may be ring-shaped. Vertical wall 106 may be oriented substantially perpendicular to top 104 and substantially perpendicular to flange 108. Top 104 may be connected through vertical wall 106 to flange 108. In addition, top 104 may be connected through vertical wall 106 and flange 108 to chamber wall 116. Dielectric member 102 may be a one-piece structure, wherein top 104, vertical wall 106, and flange 108 may be integral parts of dielectric member 102. Alternatively or additionally, one or more of top 104, vertical wall 106, and flange 108 may be one or more detachable parts of dielectric member 102.

Plasma processing system 100 may also include a set of top coils 112 (which includes one or more coils) disposed above top 104 (and disposed over top 104) for initiating the generation of plasma 128. Plasma processing system 100 may also include a first radio frequency (RF) generator connected to the set of top coils 112 for powering the set of top coils 112. The plasma density at the center of wafer 124 and/or near the center of wafer 124 may be controlled by adjusting the power supplied to the set of top coils 112 by the first generator. A horizontal bottom surface 132 of top 104 may be configured to be exposed to plasma 128 for confining plasma 128 under top 104 to process wafer 124.

Plasma processing system 100 may also include a set of side coils 114 (which includes one or more coils) surrounding vertical wall 106 and disposed over at least a portion (e.g., an inner portion) of flange 108 for generating additional ions to supplement (and/or to maintain) plasma 128, especially at the edge of wafer 124 and/or near the edge of wafer 124. Plasma processing system 100 may also include a second RF generator connected to the set of side coils 114 for powering the set of side coils 114. Accordingly, the set of side coils 114 may be powered and controlled separately and asynchronously from the set of top coils 112. The plasma density at the edge of wafer 124 and/or near the edge of wafer 124 may be controlled by adjusting the power supplied to the set of side coils 114 by the second generator. Advantageously, the set of side coils 114 may be employed to affect the density of plasma 128 (especially at the edge of wafer 124 and/or near the edge of wafer 124), thereby tuning and optimizing the distribution of plasma 128.

For preventing interference between the set of top coils 112 and the set of side coils 114, the inner diameter of the set of side coils 114 may be substantially larger than the outer diameter of the set of top coils 112, in order to provide sufficient separation between the two sets of coils. Additionally or alternatively, the frequency of the signal provided by the first RF generator may be substantially different from the frequency of the signal provided by the second RF generator.

The outer diameter of vertical wall 106 (which may be related to the position of the set of side coils 114 and may be as large as the outer diameter D1 of top 104) may be substantially smaller than the inner diameter Dw of the cylindrical chamber wall 116. The outer diameter D1 of top 104 may be greater than the outer diameter Dc of chuck 122 and may be substantially smaller than the inner diameter Dw of chamber wall 116. Additionally or alternatively, the inner diameter D3 of flange 108 (which also may be related to the position of the set of side coils 114) may be substantially smaller than the inner diameter Dw of chamber wall 116. Accordingly, the set of side coils 114 may be disposed substantially close to the edge of wafer 124; therefore, the set of side coils 114 may have a sufficiently strong effect on tuning the density of plasma 128 at the edge of wafer 124 and/or near the edge of wafer 124.

In addition, the inner diameter D2 of vertical wall 106 may be substantially smaller than the inner diameter Dw of chamber wall 116. Accordingly, a vertical inner surface 134 of vertical wall 106 (configured to be exposed to plasma 128) may confine at least a portion of the plasma in a space (e.g., partially illustrated by a space 138) adjacent to the edge of wafer 124 when wafer 124 is processed with plasma 128. Additionally or alternatively, the inner diameter D3 of flange 108 (which also may be related to the confinement of plasma 128) may be substantially smaller than the inner diameter Dw of chamber wall 116.

With the abovementioned configuration of plasma processing system 100, the plasma density (or ion density) at the edge of wafer 128 and/or near the edge of wafer 128 may be maintained at a substantially desirable level that is comparable to the plasma density at the center of wafer 128 and/or near the center of wafer 128. Advantageously, substantially uniform plasma processing rates (e.g., deposition and/or etch rates) may be provided across wafer 128, and a desirable manufacturing yield may be achieved.

Plasma processing system 100 may also include a plurality of channels (such as channel 110a, channel 110b, and channel 110c) disposed inside flange 108 for transmitting one or more gases into chamber structure 118, for generating and/or sustaining plasma 128. Flange 108 may be made of a ceramic material, such as aluminum oxide ($Al_2O_3$) or aluminum nitride (AlN). The plurality of channels may be channel structures of flange 108 evenly and circularly distributed along the ring-shaped body of flange 108. Advantageously, the one or more gases may be transmitted in a substantially even manner. In contrast with metal channels employed in conventional plasma processing systems, the ceramic inner walls of the channels inside flange 108 may be substantially resistant to potential corrosion that may be caused by, for example, a portion of plasma 128. In one or more embodiments, additional corrosion-resistant coating material may be applied to the inner walls of the channels to further improve durability of the channels.

Plasma processing system 100 may also include a gas manifold 126 (which may include one or more gas paths) coupled with flange 108 for delivering the one or more gases to the plurality of channels (including channel 110a, channel 110b, and channel 110c). Gas manifold 126 may be made of at least a metal material, such as stainless steel or aluminum, and may be electrically grounded. At least a portion of gas manifold 126 may be disposed between the plurality of channels and the set of side coils 114 to shield the plurality of channels from the magnetic field and the electric field associated with the set of side coils 114, for preventing unwanted plasma from being undesirably generated inside the channels. Gas manifold 126 advantageously provides two functions at the same time: gas delivery and shielding.

Gas manifold 126 may further include an indentation structure 136 for accommodating at least a portion of the set of side coils 114, in order to minimize the distance from the set of side coils 114 to the edge of wafer 124. In one or more embodiments, as illustrated in the example of FIG. 1B, at least a portion of the set of side coils 114 may be disposed inside indentation structure 136, such that the distance from the set of side coils 114 to the edge of wafer 124 may be minimized. Advantageously, the effects of the set of side coils 114 on plasma 128 near the edge of wafer 124 and/or at the edge of wafer 124 may be maximized for optimizing the uniformity of the processing rates across wafer 124.

Plasma processing system 100 may also include a positioning mechanism 140 coupled with the set of side coils 114 for moving and positioning the set of side coils 114 along the vertical outer surface of vertical wall 106, to provide more controllability for optimizing the effects of the set of side coils 114 on plasma distribution in addition to the controllability associated with the second RF generator, which powers the set of side coils 114. For example, positioning mechanism 140 may move the set of side coils 114 downward (e.g., at least partially into indentation structure 136) to reduce the distance between the set of side coils 114 and the edge of wafer 124, thereby increasing the effects of the set of side coils 114 on plasma 128 at the edge of wafer 124 and/or near the edge of wafer 124; positioning mechanism 140 may also move the set of side coils 114 upward (e.g., out of indentation structure 136) to increase the distance between the set of side coils 114 and the edge of wafer 124, thereby reducing the effects of the set of side coils 114.

As can be appreciated from the foregoing discussion with reference to the example of FIG. 1, plasma processing system 100 may enable increasing plasma density at the wafer edge and may enable tuning plasma distribution. Advantageously, plasma processing system 100 may provide substantially uniform plasma processing rates across wafer 124, thereby providing a desirable manufacturing yield.

Figure 2A:
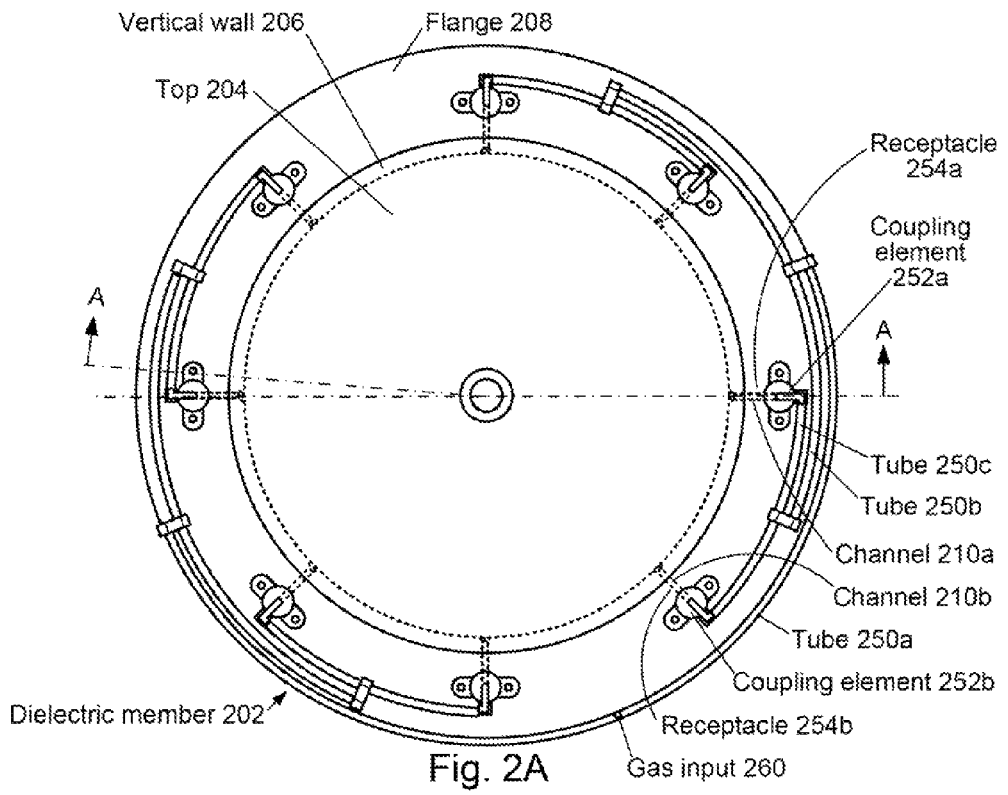
FIG. 2A shows a schematic representation illustrating a top view of a dielectric member, a plurality of tubes, and a plurality of coupling elements for use in a plasma processing system in accordance with one or more embodiments of the present invention.
Figure 2B:
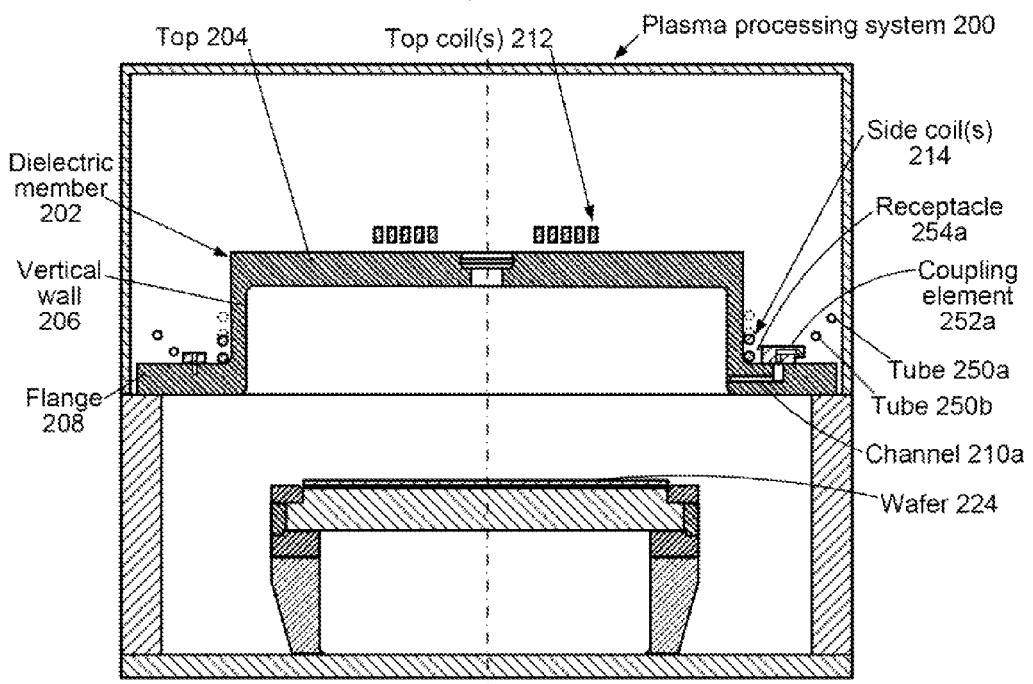
FIG. 2B shows a schematic representation illustrating a partial cross-sectional view of a plasma processing system in accordance with one or more embodiments of the present invention.

FIG. 2A shows a schematic representation illustrating a top view of a dielectric member 202, a plurality of tubes (e.g., tube 250*a*, tube 250*b*, and tube 250*c*), and a plurality of coupling elements (e.g., coupling element 252*a* and coupling element 252*b*) for use in a plasma processing system in accordance with one or more embodiments of the present invention. FIG. 2B shows a schematic representation illustrating a partial cross-sectional view of a plasma processing system 200 (which may include dielectric member 202, the tubes, and the coupling elements) in accordance with one or more embodiments of the present invention.

Plasma processing system 200 may include features and advantages similar to those related to plasma processing system 100 discussed with reference to the example of FIG. 1B. For example, similar to dielectric member 102 of plasma processing system 100, dielectric member 202 of plasma processing system 200 may include a horizontal circular top 204, a cylindrical vertical wall 206 connected to top 204, and a horizontal ring-shaped flange 208 connected to vertical wall 206. Similar to plasma processing system 100, plasma processing system 200 may include a set of top coils 212 disposed above top 204 and a set of side coils 214 surrounding vertical wall 206.

At the same time, plasma processing system 200 may include features and advantages different from features and advantages of plasma processing system 100. For example, instead of a gas manifold such as gas manifold 126 illustrated in the example of FIG. 1B, plasma processing system 200 may also include a plurality of tubes (including tube 250*a*, tube 250*b*, tube 250*c*, etc.) for delivering one or more gases to a plurality of channels (including channel 210*a*, channel 210*b*, etc.) of flange 208. The plurality of tubes may be configured with substantially equal path lengths from a gas input 260 to the plurality of channels, for providing substantially uniform pressure for gases delivered to the plurality of channels.

Tube 250*a* may be disposed over the outer edge of flange 208. Tube 250*a* may be connected through tube 250*b* to one or more of the plurality of channels, including channel 210*a* and channel 210*b*. Tube 250*b* may be connected through tube 250*c* to channel 210*a* and channel 210*b*. Tube 250*c* may be disposed lower than tube 250*b* and may be disposed closer to vertical wall 206 (and closer to the set of side coils 214) than tube 250*b*. Tube 250*b* may be disposed lower than tube 250*a* and may be disposed closer to vertical wall 206 (and closer to the set of side coils 214) than tube 250*a*. According to the configuration, the lengths of the plurality of channels of flange 208 may be minimized; therefore, the manufacturing cost for flange 208 may be advantageously minimized. At the same time, the distance between tube 250*a* and the set of side coils 214 may be maximized to minimize the effects of the set of side coils 214 on the gases delivered through tube 250*a*; accordingly, undesirable generation of unwanted plasma inside tube 250*a* may be prevented.

Plasma processing system 200 may also include a plurality of coupling elements (including coupling element 252*a*, coupling element 252*b*, etc.) for coupling the plurality of tubes with flange 208. Flange 208, vertical wall 206, and the plurality of coupling elements may form a plurality of receptacle structures, including receptacle structure 254*a*, receptacle structure 254*b*, etc., for accommodating a plurality of portions of the set of side coils 214, in order to minimize the distance from the set of side coils 214 to the edge of wafer 224. A plurality of portions of the set of side coils 214 may be disposed inside the plurality of receptacle structures such that the distance from the set of side coils 214 to the edge of wafer 224 may be minimized. Advantageously, the effects of the set of side coils 214 on the plasma near the edge of wafer 224 and/or at the edge of wafer 224 may be maximized for optimizing the uniformity of the processing rates across wafer 224.

Plasma processing system 200 may also include a positioning mechanism (e.g., a mechanism similar to position mechanism 140 illustrated in the example of FIG. 1B) for moving and positioning the set of side coils 214 along the vertical outer surface of vertical wall 206, to provide additional controllability for optimizing the effects of the set of side coils 214 on plasma distribution. For example, the positioning mechanism may move the set of side coils 214 downward (e.g., at least partially into the receptacle structures) to reduce the distance between the set of side coils 214 and the edge of wafer 224, thereby increasing the effects of the set of side coils 214 on the plasma at the edge of wafer 224 and/or near the edge of wafer 224; the positioning mechanism may also move the set of side coils 214 upward (e.g., away from the receptacle structures) to increase the distance between the set of side coils 214 and the edge of wafer 224, thereby reducing the effects of the set of side coils 214. The positioning mechanism may advantageously enhance the controllability in tuning plasma distribution.

Figure 3A:
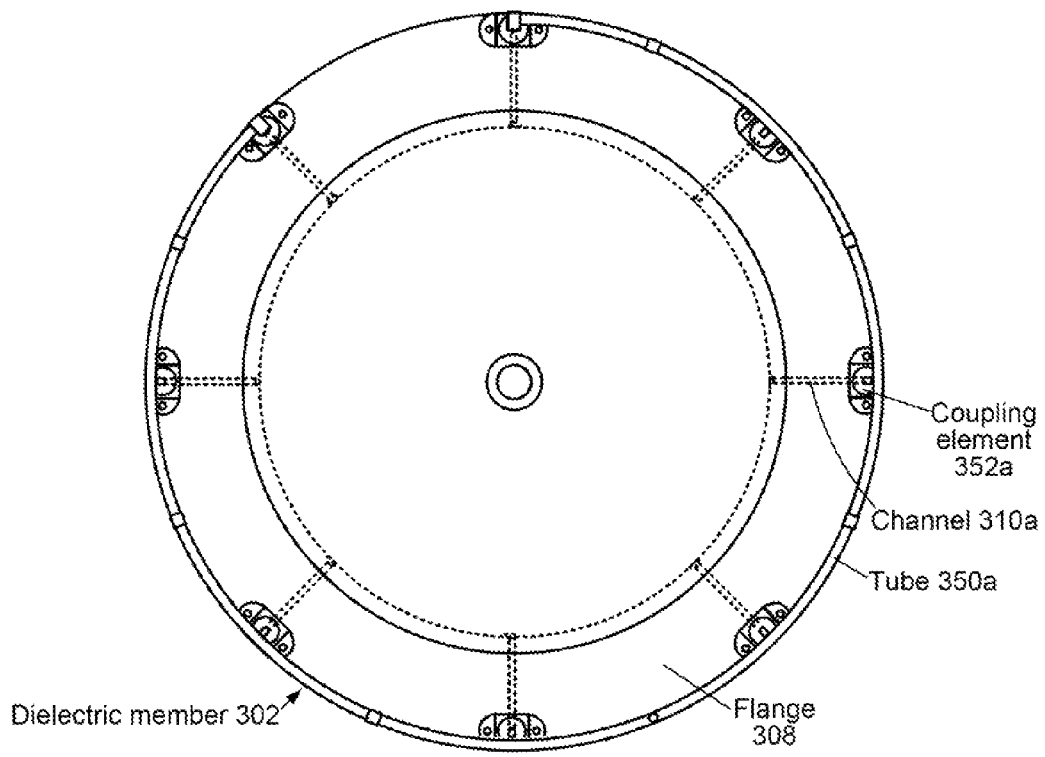
FIG. 3A shows a schematic representation illustrating a top view of a dielectric member, a plurality of tubes, and a plurality of coupling elements for use in a plasma processing system in accordance with one or more embodiments of the present invention.
Figure 3B:
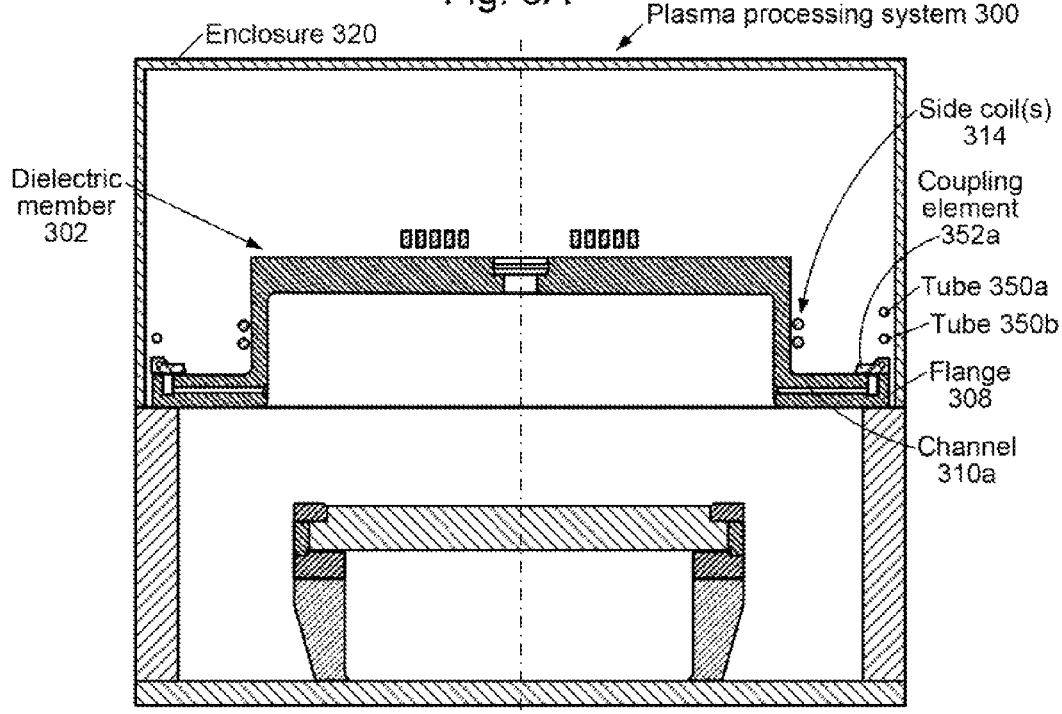
FIG. 3B shows a schematic representation illustrating a partial cross-sectional view of a plasma processing system in accordance with one or more embodiments of the present invention.

FIG. 3A shows a schematic representation illustrating a top view of a dielectric member 302, a plurality of tubes (e.g., tube 350a), and a plurality of coupling elements (e.g., coupling element 352a) for use in a plasma processing system in accordance with one or more embodiments of the present invention. FIG. 3B shows a schematic representation illustrating a partial cross-sectional view of a plasma processing system 300 (which may include dielectric member 302, the tubes, and the coupling elements) in accordance with one or more embodiments of the present invention.

Plasma processing system 300 may include features and advantages similar to those related to plasma processing system 100 discussed with reference to the example of FIG. 1B and/or plasma processing system 200 discussed with reference to the example of FIG. 2B.

At the same time, plasma processing system 300 may include features and advantages different from features and advantages of plasma processing system 100 and plasma processing system 200. For example, the plurality of coupling elements (including coupling element 352, etc.), which is configured for coupling the plurality of tubes (including tube 350a, tube 350b, etc.) with the plurality of channels (including channel 310a) of flange 308 of dielectric member 302, may be distributed along the outer edge of flange 308. Accordingly, the junctions between two or more of the channels, the tubes, the coupling elements, and flange 308 may be disposed substantially distal from the set of side coils 314. Advantageously, potential unwanted arcing at the junctions may be prevented.

As another example, tube 350a (connected through tube 350b to channel 310a) may be disposed over tube 350b along an inner portion of enclosure 320, such that both tube 350a and tube 350a are substantially vertically aligned over at least portions of the of coupling elements along the outer edge of flange 308. Accordingly, the distance from the set of side coils 314 to each of tube 350a and tube 350b may be maximized, such that the effects of the set of side coils 314 on the gases delivered through tube 350a and tube 350b may be minimized. Advantageously, unwanted plasma generation inside tube 350a and tube 350b may be prevented.

In one or more embodiments, plasma processing system 300 may also include a positioning mechanism, e.g., similar to position mechanism 140 illustrated in the example of FIG. 1B, for moving and positioning the set of side coils 314 to provide additional controllability in optimizing plasma processing uniformity.

Figure 4:
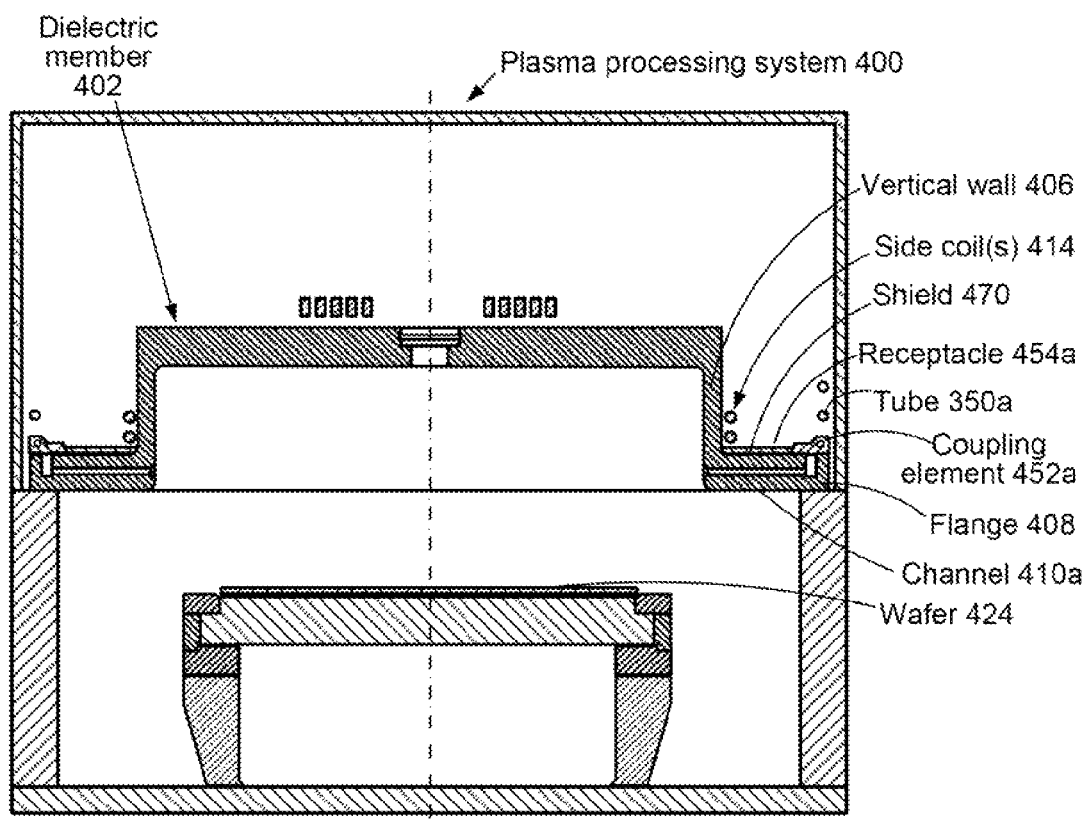
FIG. 4 shows a schematic representation illustrating a partial cross-sectional view of a plasma processing system in accordance with one or more embodiments of the present invention.

FIG. 4 shows a schematic representation illustrating a partial cross-sectional view of a plasma processing system 400 in accordance with one or more embodiments of the present invention.

Plasma processing system 400 may include features and advantages similar to those related to plasma processing system 300 illustrated in the example of FIG. 3B. In addition, plasma processing system 400 may further include a metal shield 470 surrounding vertical wall 406 of dielectric member 402 and disposed under the set of side coils 414. Metal shield 470 may be electrically grounded and may be disposed between the set of side coils 414 and the plurality of channels (including channel 410a) inside flange 408, for shielding the plurality of channels from the magnetic field and the electric field associated with the set of side coils 414. Advantageously, unwanted plasma generation inside the plurality of channels may be prevented.

Metal shield 470, vertical wall 406, and the plurality of coupling elements (such as coupling element 452a), which is configured for coupling gas delivery tubes (such as tube 350a) with the channels of flange 408, may form a plurality of receptacle structures, such as receptacle structure 454a, for accommodating a plurality of portions of the set of side coils 414, in order to minimize the distance from the set of side coils 414 to the edge of wafer 424. A plurality of portions of the set of side coils 414 may be disposed inside the plurality of receptacle structures such that the distance from the set of side coils 414 to the edge of wafer 424 may be minimized. Advantageously, the effects of the set of side coils 414 on the plasma near the edge of wafer 424 and/or at the edge of wafer 424 may be maximized for optimizing the uniformity of the processing rates across wafer 424.

Figure 5:
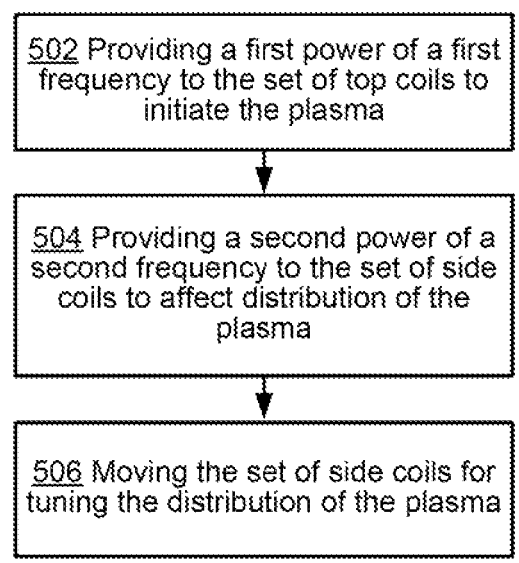
FIG. 5 shows a flowchart illustrating steps in a method for processing a wafer with plasma in a plasma processing system in accordance with one or more embodiments of the present invention.

FIG. 5 shows a flowchart illustrating steps in a method for processing a wafer with plasma in a plasma processing system (such as a plasma processing system having features discussed with reference to the examples of FIG. 1B, FIG. 2B, FIG. 3B, and/or FIG. 4) in accordance with one or more embodiments of the present invention. As discussed in the examples, the plasma processing system may include a chamber structure that includes a dielectric member. The dielectric member may include a top (or a first element), a vertical wall (or a second element), and a flange (or a third element). The plasma processing system may also include a set of top coils (disposed above the top and connected to a first generator) and a set of side coils (surrounding the vertical wall and connected to a second generator). The plasma processing system may also include a positioning mechanism for moving and positioning the set of side coils along the outer surface of the vertical wall.

The method may include step 502, in which the first generator may provide a first power of a first frequency to the set of top coils to initiate the plasma. The first frequency may be high enough to initiate the generation of the plasma. For example, the first frequency may be a radio frequency of 13.56 MHz.

After step 502, in step 504, the second generator may provide a second power of a second frequency to the set of side coils to generate additional ions to supplement the plasma, especially near the edge of the wafer and/or at the edge of the wafer, thereby affecting the distribution of the plasma, for optimizing the uniformity of the plasma processing rates across the wafer. The second frequency may be substantially different from the first frequency, such that potential interference between the first power and the second power may be prevented without requiring additional shielding arrangements. In one or more embodiments, the second frequency may be substantially lower than the first frequency. As an example, the second frequency may be a radio frequency in the range from 500 KHz to 4 MHz, such as 2 MHz.

The method may also include step 506, in which the positioning mechanism may move the set of side coils along the outer surface of the vertical wall in a direction perpendicular to the top surface of the wafer for tuning the distribution of the plasma to optimize the uniformity of the plasma processing rates across the wafer.

Step 506 may be performed when the wafer is processed in the plasma processing system to dynamically optimize the plasma processing uniformity.

Additionally or alternatively, the positioning mechanism may move the set of side coils between processes associated with different plasma processing recipes. For example, the method may include the following steps: processing the wafer using a first plasma processing recipe with the set of side coils being disposed in a first position with a first plasma-tuning effect; after processing the wafer using the first plasma processing recipe, moving the set of side coils along the outer surface to a second position; and processing the wafer using a second plasma processing recipe with the set of side coils being disposed in the second position with a second plasma-tuning effect.

Additionally or alternatively, the positioning mechanism may move and position the set of side coils at a predetermined position before step 502, i.e., before the plasma is initiated.

In one or more embodiments, the method may include one or more of steps discussed above related to utilizing one or more of the gas manifold, the indentation structure, the tubes, the coupling elements, the receptacle structures, and the metal shield with reference to the examples of FIG. 1B, FIG. 2B, FIG. 3B, and/or FIG. 4.

As can be appreciated from the foregoing, embodiments of the invention may include a set of side coils (separately powered with respect to a set of top coils) for increasing plasma density at the edge of a wafer and/or near the edge of the wafer. Accordingly, a desirable plasma density at the edge of the wafer and/or near the edge of the wafer that is comparable to the plasma density at the center of the wafer and/or near the center of the wafer may be provided. Advantageously, substantially uniform plasma processing rates across the wafer may be provided, and a desirable manufacturing yield may be achieved.

Embodiments of the invention may include one or more shielding arrangements and/or separation arrangements such that the effects of the side coils on gas transmission channels and gas transmission tubes may be minimized. Advantageously, gases may be consistently provided to maintain the consistency of plasma processes. In addition, the durability of the gas transmission channels and the gas transmission tubes may be maximized.

Embodiments of the invention may include positioning mechanisms and position accommodation arrangements to maximize the controllability in tuning plasma distribution. Advantageously, the plasma processing uniformity and the manufacturing yield may be optimized.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A plasma processing system for generating plasma to process at least a wafer and for optimizing distribution of generated plasma on the wafer, the plasma processing system comprising:
    a chuck for supporting said wafer;
    a chamber structure for containing said plasma, said chamber structure including a cylindrical chamber wall, said chamber structure further including a dielectric member disposed above said cylindrical chamber wall and coupled with said cylindrical chamber wall, said dielectric member comprising a one-piece structure having a top, a vertical wall and a flange as integral parts of the dielectric member, wherein the dielectric member is coupled to said cylindrical wall through said flange, wherein the flange includes a plurality of channels for transmitting one or more gases into the chamber structure, and wherein the top is disposed over said chuck;
    a set of top coils disposed above said top for initiating generation of said plasma, a horizontal bottom surface of said top being configured to be exposed to said plasma when said wafer is processed with said plasma;
    a set of side coils surrounding said vertical wall and disposed over at least a portion of said flange for affecting distribution of said plasma; and
    a shielding arrangement disposed between the set of side coils and the flange, a vertical inner surface of said vertical wall being configured to be exposed to said plasma when said wafer is processed with said plasma, the inner diameter of said vertical wall being smaller than the inner diameter of said cylindrical chamber wall;
    wherein the shielding arrangement is at least part of a gas manifold coupled with said flange for delivering said one or more gases to said plurality of channels, and wherein the shielding arrangement shields the plurality of channels from a magnetic field associated with the set of side coils.

2. The plasma processing system of claim 1, further comprising:
    a first generator electrically connected to said set of top coils for powering said set of top coils; and
    a second generator electrically connected to said set of side coils for powering said set of side coils.

3. The plasma processing system of claim 2, wherein the first generator and the second generator are configured to simultaneously provide a frequency of signal to the set of top coils that is at least 3× greater than the frequency of signal to the set of side coils.

4. The plasma processing system of claim 2, wherein the first generator is configured to provide higher frequency of signal to the set of top coils than the second generator is configured to provide, simultaneously as frequency of signal to the set of side coils.

5. The plasma processing system of claim 2, wherein the first generator is configured to provide a signal of 13.56 MHz to the set of top coils and the second generator is configured to simultaneously provide a signal in the range from 500 KHz to 4 MHz to the set of side coils.

6. The plasma processing system of claim 1, further comprising a positioning mechanism for moving set of side coils along a vertical outer surface of said vertical wall.

7. The plasma processing system of claim 1, wherein the dielectric member comprises a ceramic material.

8. The plasma processing system of claim 7, wherein the ceramic material comprises aluminum oxide or aluminum nitride.

9. The plasma processing system of claim 7, wherein the ceramic material comprises aluminum oxide.

10. The plasma processing system of claim 1, wherein the top of dielectric member comprises a horizontal bottom surface configured to be exposed to plasma for confining plasma under the top of the dielectric member to process the wafer.

11. The plasma processing system of claim 1, wherein the inner diameter of the set of side coils is larger than the outer diameter of the set of top coils to prevent interference between the set of side coils and the set of top coils.

12. The plasma processing system of claim 1, wherein the plurality of channels include inner walls having a corrosion-resistant coating material.

13. A plasma processing system for generating plasma to process at least a wafer and for optimizing distribution of generated plasma on the wafer, the plasma processing system comprising:

a chuck for supporting said wafer;

a chamber structure for containing said plasma, said chamber structure including a cylindrical chamber wall, said chamber structure further including a dielectric member disposed above said cylindrical chamber wall and coupled with said cylindrical chamber wall, said dielectric member comprising a one-piece structure having a top, a vertical wall and a flange as integral parts of the dielectric member, wherein the dielectric member is coupled to said cylindrical wall through said flange, wherein the flange includes a plurality of channels for transmitting one or more gases into the chamber structure, and wherein the top is disposed over said chuck;

a set of top coils disposed above said top for initiating generation of said plasma, a horizontal bottom surface of said top being configured to be exposed to said plasma when said wafer is processed with said plasma;

a set of side coils surrounding said vertical wall and disposed over at least a portion of said flange for affecting distribution of said plasma; and a shielding arrangement disposed between the set of side coils and the flange, a vertical inner surface of said vertical wall being configured to be exposed to said plasma when said wafer is processed with said plasma, the inner diameter of said vertical wall being smaller than the inner diameter of said cylindrical chamber wall;

wherein:

the shielding arrangement is at least part of a gas manifold coupled with said flange for delivering said one or more gases to said plurality of channels, and wherein the shielding arrangement shields the plurality of channels from a magnetic field associated with the set of side coils;

said gas manifold includes an indentation structure, and at least a portion of said set of side coils is disposed inside said indentation structure.

14. The plasma processing system of claim 13, wherein the indentation structure is disposed in the gas manifold proximal to the vertical wall.

15. A plasma processing system for generating plasma to process at least a wafer and for optimizing distribution of generated plasma on the wafer, the plasma processing system comprising:

a chuck for supporting said wafer;

a chamber structure for containing said plasma, said chamber structure including a cylindrical chamber wall, said chamber structure further including a dielectric member disposed above said cylindrical chamber wall and coupled with said cylindrical chamber wall, said dielectric member comprising a one-piece structure having a top, a vertical wall and a flange as integral parts of the dielectric member, wherein the dielectric member is coupled to said cylindrical wall through said flange, wherein the flange includes a plurality of channels for transmitting one or more gases into the chamber structure, and wherein the top is disposed over said chuck;

a set of top coils disposed above said top for initiating generation of said plasma, a horizontal bottom surface of said top being configured to be exposed to said plasma when said wafer is processed with said plasma;

a set of side coils surrounding said vertical wall and disposed over at least a portion of said flange for affecting distribution of said plasma; and a shielding arrangement disposed between the set of side coils and the flange, a vertical inner surface of said vertical wall being configured to be exposed to said plasma when said wafer is processed with said plasma, the inner diameter of said vertical wall being smaller than the inner diameter of said cylindrical chamber wall;

wherein the shielding arrangement is at least part of a gas manifold coupled with said flange for delivering said one or more gases to said plurality of channels, and wherein the gas manifold comprises a metal material, thus shielding the plurality of channels from a magnetic field associated with the set of side coils.

\* \* \* \* \*